(12) United States Patent
Hoover et al.

(10) Patent No.: US 7,123,068 B1
(45) Date of Patent: Oct. 17, 2006

(54) FLIP-FLOP CIRCUIT HAVING LOW POWER DATA RETENTION

(75) Inventors: Andrew P. Hoover, Austin, TX (US); Brian M. Millar, Austin, TX (US); Milind P. Padhye, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 74 days.

(21) Appl. No.: 11/097,658

(22) Filed: Apr. 1, 2005

(51) Int. Cl.
*H03K 3/289* (2006.01)

(52) U.S. Cl. ........................ 327/202; 327/203

(58) Field of Classification Search ............... 327/202, 327/203
See application file for complete search history.

(56) References Cited

U.S. PATENT DOCUMENTS

| | | | |
|---|---|---|---|
| 6,492,854 B1 | 12/2002 | Ku | 327/202 |
| 6,870,412 B1 * | 3/2005 | Cho | 327/202 |
| 6,873,197 B1 * | 3/2005 | Kanba | 327/202 |
| 2004/0090256 A1 * | 5/2004 | Cho | 327/202 |

* cited by examiner

*Primary Examiner*—Long Nguyen
(74) *Attorney, Agent, or Firm*—Daniel D. Hill; James L. Clingan, Jr.

(57) ABSTRACT

A flip-flop (10) has a normal mode and a low power mode to save power. The flip-flop (10) has a master latch (14) and a slave latch (20). The slave latch (20) is used to retain the condition of the flip-flop (10) during the low power mode, where power is withdrawn from the master latch (14) but maintained on the slave latch (20). The slave latch (20) may use transistors with lower leakage characteristics than the transistors that make up the master latch (14). These lower leakage characteristics may be achieved by a higher threshold voltage and/or a thicker gate dielectric. Operating speed of the flip-flop (10) is maintained by implementing the slave latch (20) so that no logic gate or switching transistor is in the critical timing path. Instead, the slave latch (20) has an input/output terminal to tap into the signal path between the master latch and an output circuit (22).

20 Claims, 5 Drawing Sheets

FLIP-FLOP CIRCUIT HAVING LOW POWER DATA RETENTION

RELATED APPLICATIONS

A related, copending application is entitled "Flip-Flop Circuit Having Low Power Data Retention", by Padhye et al., Ser. No. 11/097,659, is assigned to the assignee hereof, and filed concurrently herewith.

A related, copending application is entitled "State Retention Within A Data Processing System", by Padhye et al., application Ser. No. 10/818,861, is assigned to the assignee hereof, and filed on Apr. 6, 2004.

A related, copending application is entitled "State Retention Within A Data Processing System", by Padhye et al., application Ser. No. 10/819,383, is assigned to the assignee hereof, and filed on Apr. 6, 2004.

FIELD OF THE INVENTION

This invention relates generally to integrated circuits, and more particularly to a flip-flop circuit with low power data retention.

RELATED ART

Lower power consumption has been gaining importance in integrated circuit data processing systems due to, for example, wide spread use of portable and handheld applications. Most circuits in handheld devices are typically off (e.g., in an idle or deep sleep mode) for a significant portion of time, consuming only leakage power. As transistor leakage currents increase with finer geometry manufacturing processes, it becomes more difficult to meet chip leakage targets using traditional power reduction techniques. Therefore, reducing leakage current is becoming an increasingly important factor in extending battery life.

One method that has been used to reduce leakage current of integrated circuits is to increase the threshold voltage of the transistors in the device. However, simply increasing the threshold voltage of the transistors may result in unwanted consequences such as slowing the operating speed of the device and limiting circuit performance.

Another method that has been used to reduce leakage current is to "power gate", or cut off power to certain blocks of the integrated circuit that are not needed when the device is in a low power mode. However, in doing so, the state of the circuit block is lost. In many circuit blocks state retention is needed in order to prevent loss of important information and allow for proper circuit operation and performance when recovering from a low power mode. Therefore, a need exists for improved circuitry and methods for state retention during, for example, idle or deep sleep modes, which may therefore help in reducing leakage power and extending battery life.

BRIEF DESCRIPTION OF THE DRAWINGS

The present invention is illustrated by way of example, and not by way of limitation, in the figures of the accompanying drawings and in which like reference numerals refer to like elements and in which.

DESCRIPTION OF A PREFERRED EMBODIMENT

Generally, in one embodiment, the present invention provides a flip-flop circuit that retains its state in a low leakage slave latch during a low power mode. The flip-flop includes a master latch and the low leakage slave latch. The master latch is coupled to receive a power supply voltage that is removed during the low power mode. The slave latch receives a power supply voltage that is maintained during the low power mode. The master latch latches an input signal during a normal operating mode, and is non-functional in response to entering the low power mode. The slave latch has an input/output terminal coupled to the master latch via a transmission gate. The slave latch stores the logic state of a signal received from the master latch during the normal operating mode. When power is removed from the master latch during the low power operating mode, the slave latch maintains the latched logic state.

During normal operation, the slave latch logic does not cause a logic path delay because the slave latch logic is not in a "critical path", that is, the clock input to data output path, of the integrated circuit. In addition to maintaining a logic state during a low power mode, the slave latch is also used when the flip-flop is operating in a normal mode, and with only negligible timing delays. The negligible timing delays are caused by, for example, capacitive loading. The slave latch may be implemented using one or more low leakage transistors, thus further reducing the leakage current.

Figure 1:
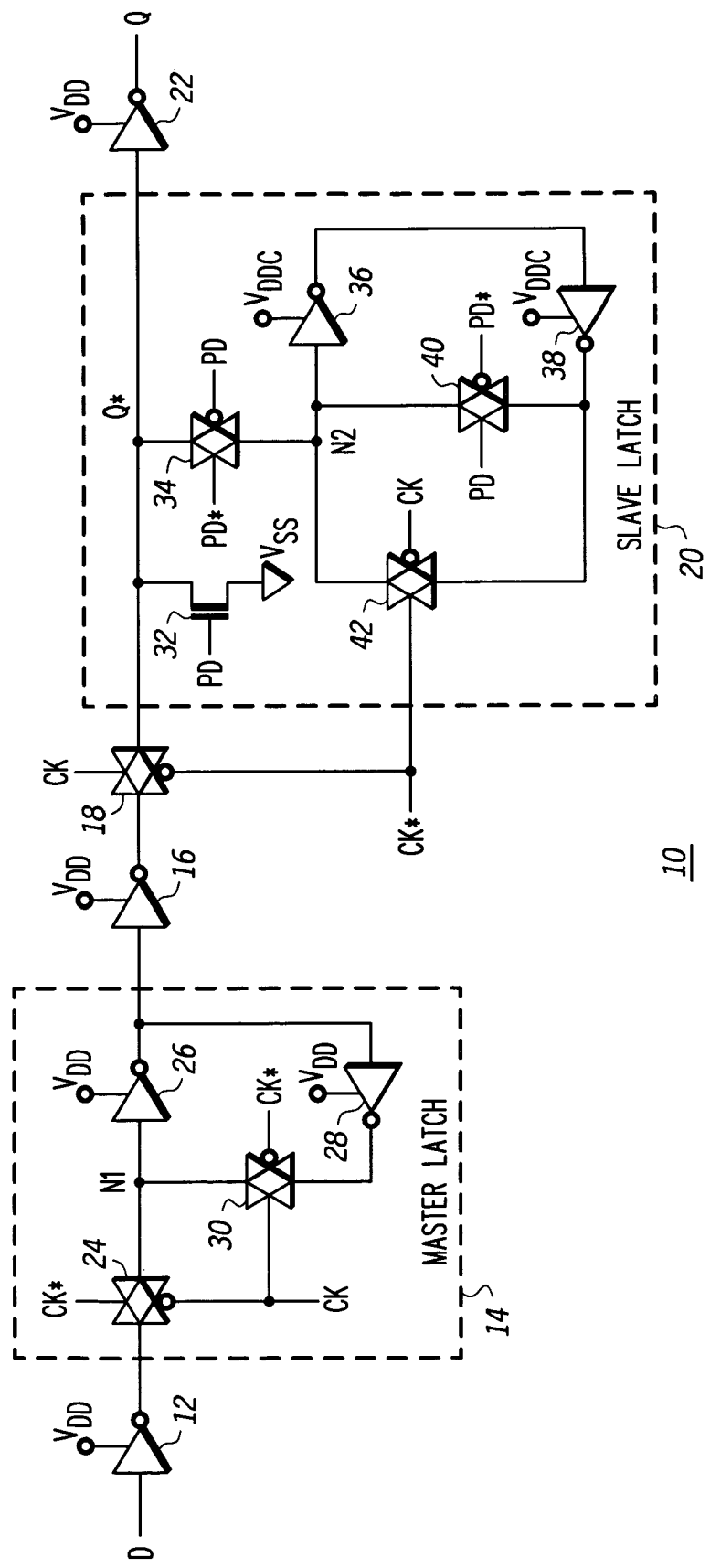
FIG. 1 illustrates, in logic diagram form, a flip-flop circuit in accordance with one embodiment of the present invention.

FIG. 1 illustrates, in logic diagram form, a flip-flop circuit 10 in accordance with one embodiment of the present invention. Flip-flop circuit 10 is implemented on an integrated circuit using CMOS (complementary metal oxide semiconductor) process technology. Flip-flop circuit 10 includes an inverter 12, a master latch 14, an inverter 16, a transmission gate 18, a slave latch 20, and an output inverter 22. The master latch 14 includes transmission gates 24 and 30 and inverters 26 and 28. The slave latch 20 includes N-channel transistor 32, transmission gates 34, 40, and 42, and inverters 36 and 38.

Inverter 12 has an input for receiving an input signal labeled "D", and an output. Transmission gate 24 has an input connected to the output of inverter 12, and an output labeled node "N1". Inverter 26 has an input connected to node N1. An output of inverter 28 is connected to an input of transmission gate 30. Transmission gates 24 and 30 each have true and complementary control inputs for receiving clock signals. Note that an asterisk (*) is used to indicate that a signal name having the asterisk is a logical complement of a signal having the same name but lacking the asterisk. Transmission gate 30 receives CK on its true control input and CK* on its complementary control input. Transmission gate 24 receives CK* on its true control input and CK on its complementary control input. An output of transmission gate 30 is coupled to node N1. The output of inverter 26 is coupled to an input of transmission gate 18 through inverter 16. Transmission gate 18 is controlled using complementary clock signals CK/CK*. An output of transmission gate 18 is connected to an input of inverter 22. An output of inverter 22 provides an output signal labeled "Q".

In slave latch 20, transmission gate 34 is controlled by complementary power down control signals labeled "PD" and "PD*". Transmission gate 34 connects internal nodes labeled "N2" and "Q*". Inverter 36 has an input connected to node N2, and an output connected to an input of inverter 38. Inverter 38 has an output coupled to the inputs of transmission gates 40 and 42. Transmission gate 42 is controlled with clock signals CK/CK* and has an output connected to node N2. Transmission gate 40 is controlled with control signals PD/PD* and has an output connected node N2. N-channel transistor 32 has a drain (current electrode) connected to the node Q*, a gate (control electrode) for receiving control signal PD, and a source (current electrode) connected to a power supply voltage terminal labeled "VSS". The control signal PD is de-asserted as a logic low during a normal operating mode, and is asserted as a logic high during a power down mode. Note that transmission gates 34, 40, and 42 functions as switches and may be implemented using, for example, a single transistor in other embodiments.

A power supply voltage labeled "VDD" is provided to inverters 26 and 28 of master latch 14, and to inverters 12, 16, and 22. A power supply voltage labeled "VDDC" is provided to inverters 36 and 38 of slave latch 20. During low power mode, the power supply voltage VDD may be removed, meaning that it may be disconnected, allowing leakage currents to slowly pull it towards VSS, or it may be forcibly driven to VSS. The power supply voltage VDDC remains on during low power mode. The power supply voltages VDD and VDDC may be provided by the same power supply source, or by separate sources.

The transistors of slave latch 20 are implemented to have a lower leakage current than the transistors of master latch 14, inverters 12, 16, and 22, and transmission gate 18. Three example ways to achieve lower leakage current on selected devices are to use higher threshold voltages, longer channel lengths, and/or thicker gate dielectric thicknesses. Techniques such as these can be used individually or combined.

Figure 2:
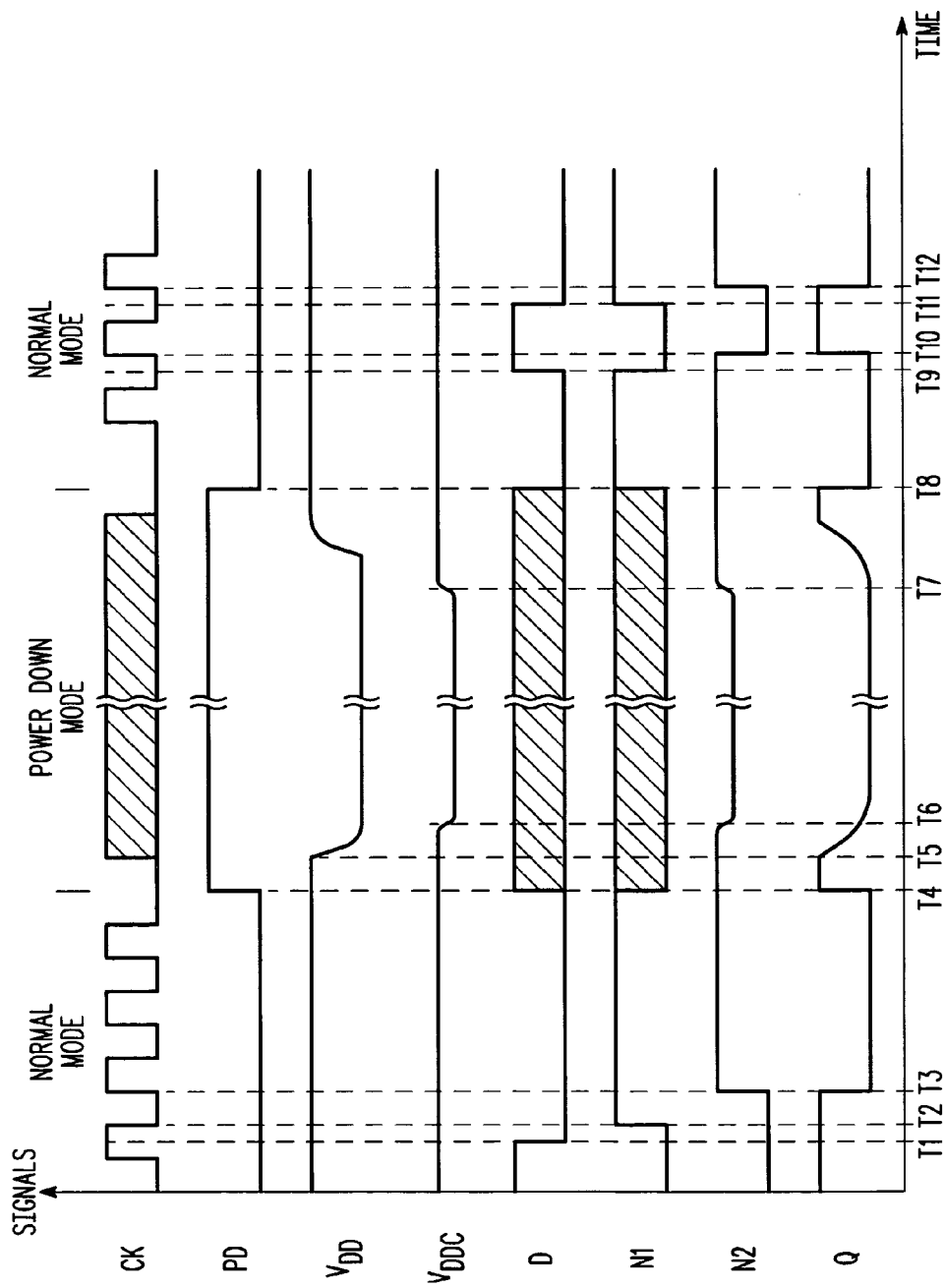
FIG. 2 illustrates a timing diagram of various signals of the flip-flop circuit of FIG. 1.

FIG. 2 illustrates a timing diagram of various signals of the flip-flop circuit 10 of FIG. 1. The operation of flip-flop 10 will be described with reference to both FIG. 1 and FIG. 2. Note that in FIG. 2, cross-hatched areas indicate when the logic state of a signal does not matter. During this time, these signals may be at the potential of VDD, VSS, or somewhere in between.

During a normal operating mode, labeled "NORMAL MODE" in FIG. 2, flip-flop 10 functions as a conventional D type flip-flop. The master latch 14 receives an input signal based of input logic signal D at time T1. The input signal is passed through transmission gate 24 to the pair of inverters 26 and 28 during the time when clock signal CK is a logic low. The logic state of node N1 becomes a logic high at time T2. The pair of inverters 26 and 28 function as the storage element for the master latch 14 when CK is high while the signal is being passed through inverter 16, transmission gate 18 and inverter 22. The output signal Q is provided at the output of inverter 22 at time T3 when clock signal CK is a logic high. In the illustrated embodiment, Q is provided having the same logic state as input signal D. However, in other embodiments, it may be desired to provide Q as a logical complement of signal D. To do this, the inverter 16 may, for example, be omitted.

Also, during the normal mode, the logic state of master latch 14 is retained by slave latch 20. Because control signal PD is a logic low during the normal operating mode, transmission gate 34 is conductive and transmission gate 40 is non-conductive, and the pair of inverters 36 and 38 store the logic state provided to node N2 when clock signal CK becomes a logic low. Note that transmission gate 42 is conductive each time clock signal CK is a logic low, thus causing the contents of slave latch 20 to hold the logic state while the clock is low. At time T3, the logic state of node N2 becomes a logic high at about the same time that Q becomes a logic low if propagation delays are ignored. Note that in the illustrated embodiment, the transmission gates are implemented conventionally with parallel-connected P-channel and N-channel transistors that are controlled using complementary signals. In other embodiments, the transmission gates may be implemented as single transistors that receive one single-ended control signal.

During a low power operating mode, labeled "POWER DOWN MODE" in FIG. 2, the power down signal PD is asserted as a logic high as illustrated at time T4 in FIG. 2. The transmission gate 34 becomes non-conductive, and functions to isolate the pair of inverters 36 and 38 from the rest of the circuit. Transmission gate 40 becomes conductive, coupling the input of inverter 36 to the output of inverter 38 so that the logic state stored by inverters 36 and 38 is maintained during the power down mode. The input signal D is "don't care" during power down, as illustrated in FIG. 2, because the slave latch 20 is isolated from the master latch 14 by transmission gate 34. Also, during power down, the state of the clock signal may float. Transmission gate 42 may be conductive or non-conductive, since transmission gate 40 will guarantee that the slave latch is closed. N-channel transistor 32 becomes conductive during the power down mode, causing a voltage at the input of inverter 22 to be substantially VSS. In the illustrated embodiment, VSS is at ground potential. This keeps node Q* at a fixed logic value, and prevents excessive current from VDD to VSS inside of inverter 22 prior to removing VDD. Because the slave latch 20 is not in the critical timing path, it may be implemented using transistors having a relatively higher threshold voltage (VT) than the transistors to further reduce leakage current during power down.

Also during the low power mode, the power supply is removed, or turned off, after a period of time at time T5. The period of time is necessary to allow the PD signal to propagate to all flip-flops before VDD is removed. In addition, as illustrated in FIG. 2 at time T6, the power supply voltage VDDC may be reduced to further reduce leakage current of the slave latch. To return to normal mode, at time T7, the power supply voltages VDD and VDDC are returned to the normal mode voltage levels. Then at time T8, the power down signal PD is returned to a logic low. Between times T8 and T12, the flip-flop 10 is illustrated functioning again in normal mode. At time T9, input signal D transitions to a logic high, causing node N1 to become a logic low. Node N2 becomes a logic low at time T10. At time T11, input signal D transitions to a logic low, and node N1 becomes a logic high, followed by node N2 becoming a logic high and output signal Q becoming a logic low at time T12.

Figure 3:
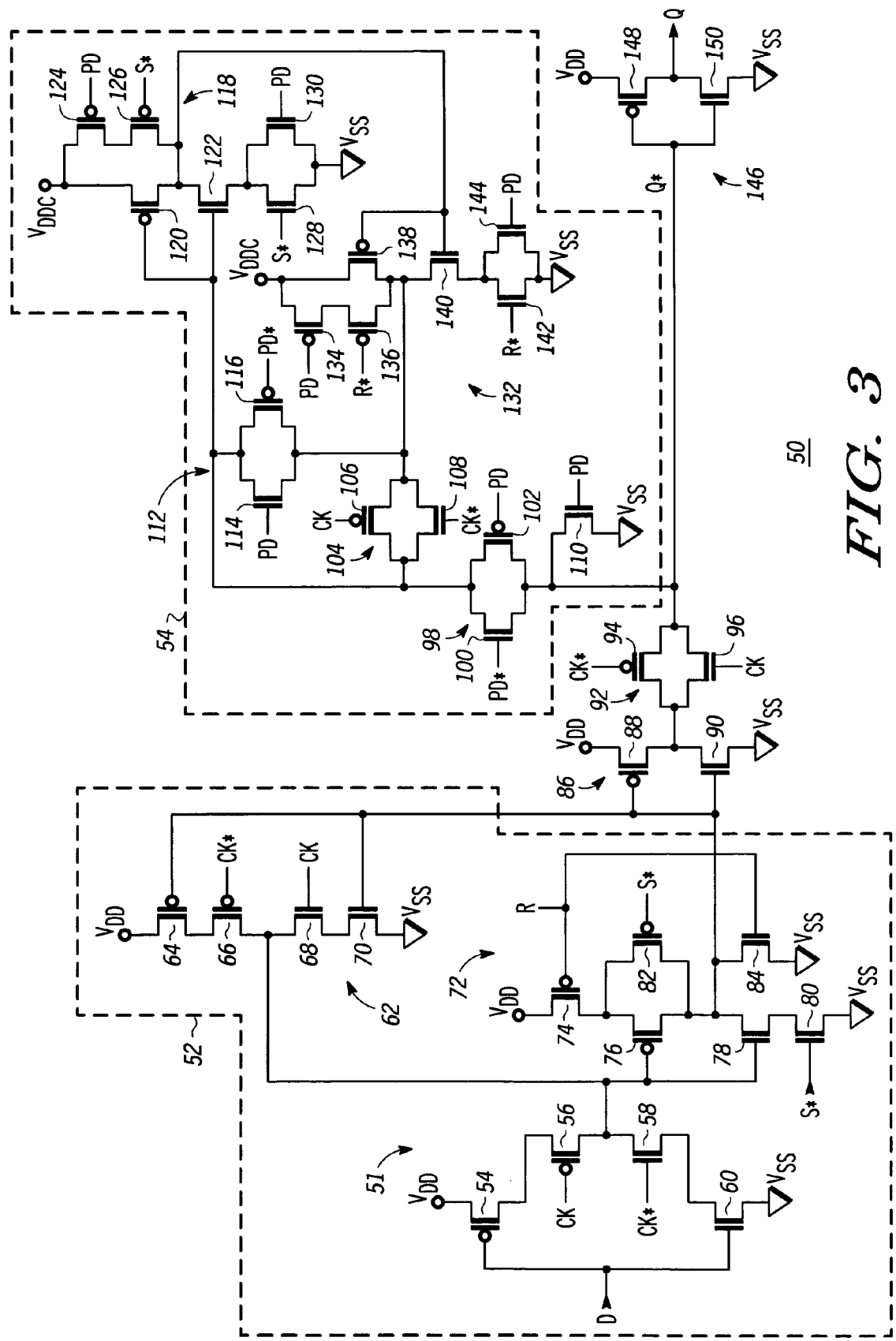
FIG. 3 illustrates, in schematic diagram form, a flip-flop circuit in accordance with another embodiment of the present invention.

FIG. 3 illustrates, in schematic diagram form, a flip-flop circuit 50 in accordance with another embodiment of the present invention. Flip-flop circuit 50 includes a master latch 52, an inverter 86, a transmission gate 92, a slave latch 54, and an inverter 146. The master latch 52 includes an inverter/transmission gate 51, an inverter/transmission gate 62, and an inverting circuit 72. The slave latch 54 includes transmission gates 98, 104, and 112, inverting circuits 118 and 132. The flip-flop 50 functions similarly to flip-flop 10 in FIG. 1, except that flip-flop 50 includes a set/reset function. One way to implement the set/reset function in several of the inverting circuits is illustrated in FIG. 3 and will be described below.

The inverting circuits 51, 62, and 72 of master latch 52 receive a power supply voltage labeled "VDD". The inverting circuits 118 and 132 of slave latch 54 receive a power supply voltage labeled "VDDC". The power supply voltage VDD may be switched off during low power mode to reduce leakage current. The power supply voltage VDDC is always "on". Also, the voltage of VDDC can be reduced during low power mode to further reduce leakage current during a low power mode. Inverter/transmission gate 51 includes P-channel transistors 54 and 56 and N-channel transistors 58 and 60. Inverter/transmission gate 62 includes P-channel transistors 64 and 66 and N-channel transistors 68 and 70. As illustrated in FIG. 3, the inverter/transmission gates 51 and 62 include both an inverter function and a transmission gate function. In other embodiments, the inverter and the transmission gate of inverter/transmission gates 51 and 62 can be implemented separately. Inverting circuit 72 includes P-channel transistors 74, 76, and 82 and N-channel transistors 78, 80, and 84. Inverting circuit 72 includes the additional functions of set and reset. Inverter 86 includes P-channel transistor 88 and N-channel transistor 90. Transmission gate 92 includes P-channel transistor 94 and N-channel transistor 96. Transmission gate 98 includes N-channel transistor 100 and P-channel transistor 102. Transmission gate 104 includes P-channel transistor 106 and N-channel transistor f08. Inverting circuit 118 includes P-channel transistors 120, 124, and 126 and N-channel transistors 122, 128, and 130. Inverting circuit 118 includes the set function and transistors for disabling the set function when power down signal PD is asserted during a low power mode. Inverting circuit 132 includes P-channel transistors 134, 136, and 138 and N-channel transistors 140, 142, and 144. Inverting circuit 132 includes the reset function and transistors for disabling the reset function when power down signal PD is asserted during low power mode. Inverter 146 includes P-channel transistor 148 and N-channel transistor 150. Transmission gate 112 includes n-channel transistor 114 and p-channel transistor 116.

In normal operation of flip-flop 50, an input signal D is provided at the input of inverter/transmission gate 51. A reset signal R and a set signal S are normally logic low voltages. When clock signal CK is a logic low, the signal D is inverted and provided to an input of inverting circuit 72. The logic state of D* is stored in the pair of inverting circuits 72 and 62 when clock signal CK is a logic high. The output of inverting circuit 72 forms the output of master latch 52 and is connected to the input of inverter 86. When clock signal CK becomes high, the output of inverter 86 is provided to the input of inverter 146 and to slave latch 54. The output of inverter 146 provides signal Q at the same logic state as input signal D. During normal operation of the slave latch, the power down signal PD is a logic low, causing transmission gate 98 to be conductive and transmission gate 112 to be substantially non-conductive. Set signal S* is a logic high, and reset signal R* is a logic high. The logic state of Q* is stored by the pair of inverting circuits 118 and 132.

During a low power mode of operation, the power down signal PD is provided as a logic high. The transmission gate 98 becomes substantially non-conductive, isolating the pair of inverting circuits 118 and 132. As discussed above, the power supply voltage VDD may be disconnected while the power supply voltage VDDC remains on, or optionally, at a reduced voltage to further reduce leakage current. The clock signal CK can be fixed or allowed to float without any adverse effect. Transmission gate 112 is conductive and provides a feedback path for the slave latch. The N-channel transistor 110 is conductive, causing the input of inverter 146 to be driven to a logic low.

The flip-flop 50 includes a set/reset function. As can be seen from flip-flop 50, in normal operation (PD de-asserted), when R is asserted to logic high, Q is forced to a logic low, regardless of the state of CK. Similarly, in normal operation (PD de-asserted), when S is asserted to logic high, Q is forced to a logic high, regardless of the state of CK. In the illustrated embodiment, reset has a higher priority than set if both reset and set are asserted at the same time. Note that during low power mode, the set signal S and reset signal R can float without affecting the state of slave latch 54. This is achieved by transistors 124, 130, 134, and 144, which bypass the set/reset function in the slave latch when PD is asserted. Also, note that other embodiments may have the reset function without the set function, or conversely, the set function without the reset function, or another reset/set priority scheme.

Figure 4:
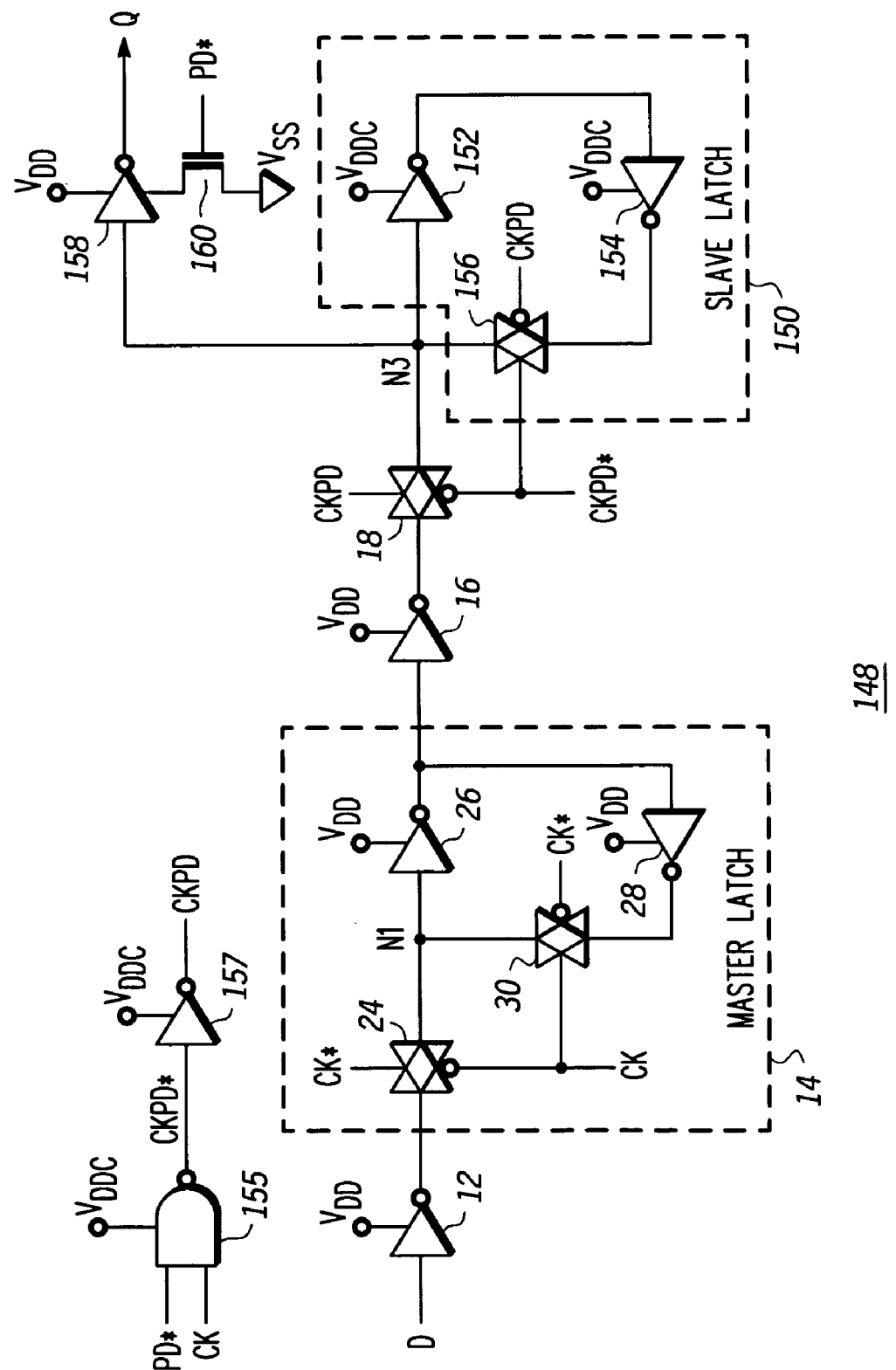
FIG. 4 illustrates, in logic diagram form, a flip-flop circuit in accordance with another embodiment of the present invention.

FIG. 4 illustrates, in logic diagram form, a flip-flop circuit 148 in accordance with another embodiment of the present invention. Note that throughout the figures, the same reference numbers will be used for like or similar elements for the purpose of brevity. Flip-flop circuit 148 includes inverters 12, 16, and 158, master latch 14, transmission gate 18, slave latch 150, and N-channel transistor 160. As illustrated above in FIG. 1, the inverters in the master latch receive a power supply voltage labeled "VDD" that is removed during low power modes of operation, and the inverters in the slave latch receive a power supply voltage labeled "VDDC" that remains on at all times. Optionally, the power supply voltage VDDC may be reduced during a low power mode.

Flip-flop 148 differs from flip-flop 10 in that power down signal PD* and clock signal CK have been combined to create signals labeled "CKPD" and "CKPD*", thus reducing the number of transmission gates in slave latch 150 as compared to slave latch 20 (FIG. 1). NAND logic gate 155 and inverter 157 are illustrated in FIG. 4 as a way to implement the combinational logic, which is powered by VDDC. In slave latch 150, inverter 152 has an input coupled to the output of transmission gate 18 at an input/output node labeled "N3", and an output. Inverter 154 has an input coupled to the output of inverter 152, and an output. Transmission gate 156 has a first signal terminal coupled to the output of transmission gate 18, a second signal terminal coupled to the output of inverter 154, and control inputs for receiving the combined clock and power down signals CKPD/CKPD*.

During a normal operating mode, power down signal PD is not asserted and transmission gate 18 is conductive and transmission gate 156 is non-conductive during logic high clock periods of clock signal CK to allow the output of inverter 16 to pass to inverter 158. During a low power mode, power down signal PD is asserted and transmission gate 18 is non-conductive and transmission gate 156 is conductive to isolate slave latch 150 from master latch 14 and inverter 16 and to allow slave latch 150 to retain the last logic state provided by master latch 14. Also, during the low power mode, a logic low power down signal PD* causes an optional low-leakage N-channel transistor 160 to eliminate a path to ground for inverter 158. Transistor 160 is necessary only if transistors with significant gate leakage are used for inverter 158.

Flip-flop 148 has an advantage of fewer transistors over the embodiment of FIG. 1, but suffers a performance penalty because the logic to combine clock signal CK and power down signal PD* are on the critical time path. Flip-flop 148 may be desirable over flip-flop 10 in applications where saving surface area on an integrated circuit die is more important that operating speed.

Figure 5:
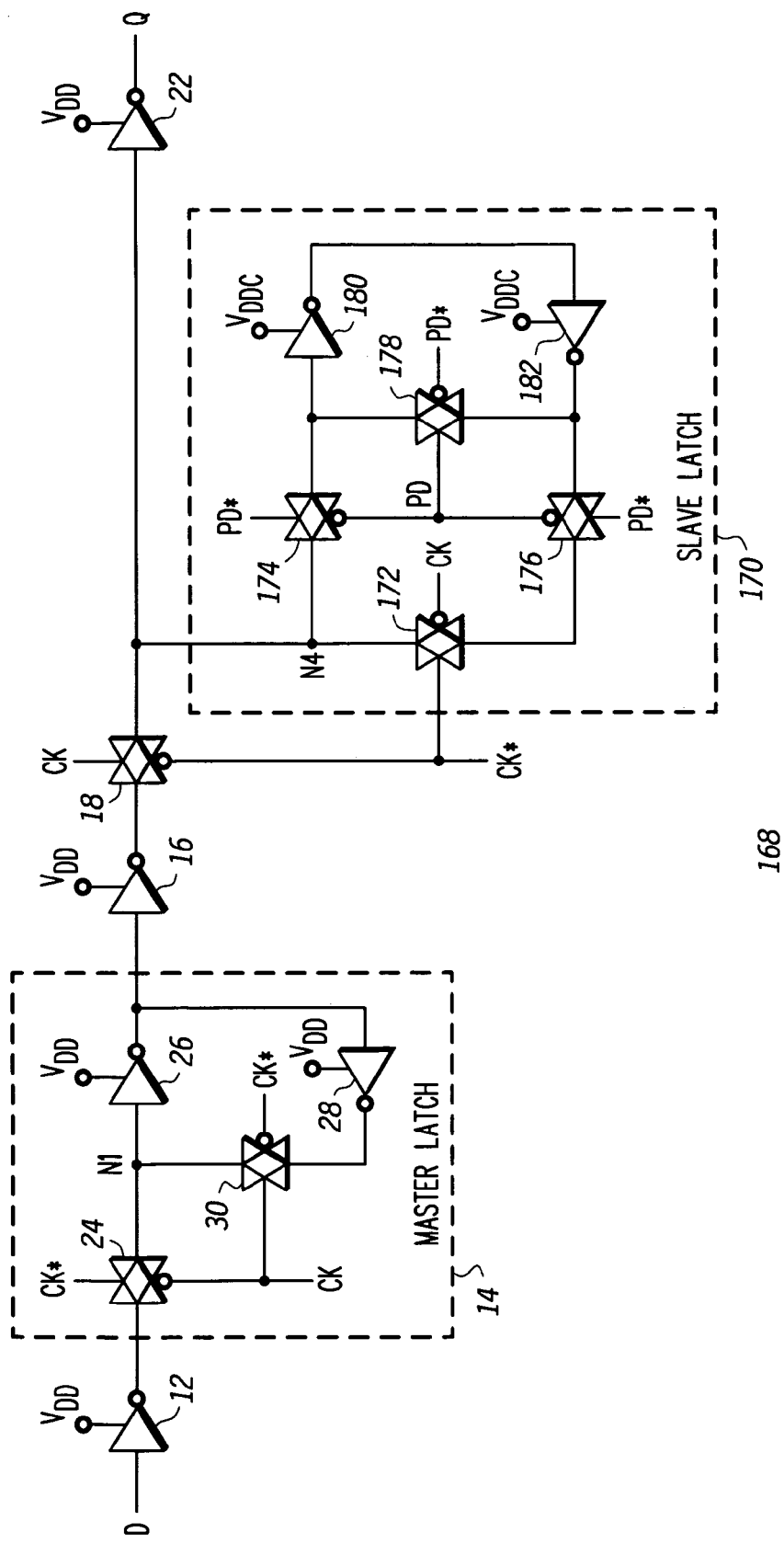
FIG. 5 illustrates, in logic diagram form, a flip-flop circuit in accordance with another embodiment of the present invention.

FIG. 5 illustrates, in logic diagram form, a flip-flop circuit 168 in accordance with another embodiment of the present invention. Flip-flop circuit 168 includes inverters 12, 16, and 22, master latch 14, transmission gate 18, and slave latch 170. Slave latch 170 includes transmission gates 172, 174, 176, and 178, and inverters 180 and 182. As illustrated above in FIG. 1 and FIG. 4, the inverters in the master latch receive a power supply voltage labeled "VDD" that is removed during low power modes of operation, and the inverters in the slave latch receive a power supply voltage labeled "VDDC" that remains on at all times. Optionally, the power supply voltage VDDC may be reduced during a low power mode.

Flip-flop 168 differs from flip-flop 10 in that it includes two isolation transmission gates 174 and 176 instead of one. In slave latch 170, transmission gate 174 has a first signal terminal coupled to transmission gate 18 at an input/output node labeled "N4", a second signal terminal coupled to the input of the inverter 180, and control inputs for receiving power down signals PD/PD*. Transmission gate 172 has a first signal terminal coupled to the first signal terminal of transmission gate 174, a second signal terminal, and a control input for receiving clock signals CK/CK*. Transmission gate 176 has a first signal terminal coupled to the second signal terminal of transmission gate 172, a second signal terminal coupled to the output of inverter 182, and a control input for receiving power down signals PD/PD*. Transmission gate 176 has a first signal terminal coupled to the input of inverter 180, a second signal terminal coupled to the output of inverter 182, and a control input for receiving power down signals PD/PD*.

During a normal operating mode, power down signal PD is not asserted and transmission gates 174 and 176 are conductive and transmission gate 178 is non-conductive. During a low power mode, power down signal PD is asserted and transmission gates 174 and 176 are non-conductive and transmission gate 178 is conductive to isolate inverters 180 and 182 and to allow slave latch 170 to retain the last logic state provided by master latch 14.

While the invention has been described in the context of a preferred embodiment, it will be apparent to those skilled in the art that the present invention may be modified in numerous ways and may assume many embodiments other than that specifically set out and described above. For example, the illustrated embodiment describes an N-channel transistor 32 that pulls the node Q* to VSS. In other embodiments, the node Q* may be pulled to, for example, VDD.

Accordingly, it is intended by the appended claims to cover all modifications of the invention which fall within the true scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A flip-flop, comprising:
   a master latch that has a signal terminal for receiving an input signal, a control input for receiving a clock signal, and an output;
   an output circuit having an input coupled to the output of the master latch and having an output that provides an output of the flip-flop;
   a slave latch coupled to the output of the master latch, the slave latch comprising:
   a first switch having a first signal terminal coupled to the output of the master latch, a second signal terminal, and a control input that receives a power down signal;
   a first inverting circuit having an input coupled to the second signal terminal of the first switch and an output;
   a second inverting circuit having an input coupled to the output of the first inverting circuit and an output;
   a second switch having a first signal terminal coupled to the input of the first inverting circuit, a second signal terminal coupled to the output of the second inverting circuit, and a control input for receiving the clock signal; and
   a third switch having a first signal terminal coupled to the input of the first inverting circuit, a second signal terminal coupled to the output of the second inverting circuit, and a control input for receiving the power down signal.

2. The flip-flop of claim 1, wherein the master latch comprises a first plurality of transistors, with at least one transistor of the first plurality of transistors having a first gate dielectric thickness and the slave latch has a second plurality of transistors having a second gate dielectric thickness that is greater than the first gate dielectric thickness.

3. The flip-flop of claim 1, wherein:
   the control input of the first switch comprises a true input and a complementary input for receiving complementary and true components of the power down signal, respectively; and
   the control input of the third switch comprises a true input and a complementary input for receiving the true and complementary components of the power down signal, respectively.

4. The flip-flop of claim 1, further comprising a fourth switch having a control input for receiving the clock signal and first and second signal terminals coupled between the output of the master latch and the first signal terminal of the first switch.

5. The flip-flop of claim 1, further comprising a first transistor having a first current electrode coupled to the first signal terminal of the first switch, a second current electrode coupled to a reference terminal, and a control gate for receiving the power down signal.

6. The flip-flop of claim 1, further comprising a reset circuit coupled to at least one of the first inverting circuit and the second inverting circuit.

7. The flip-flop of claim 1, further comprising a set circuit coupled to at least one of the first inverting circuit and the second inverting circuit.

8. A flip-flop circuit having a normal mode and a power down mode, comprising:
   master latch means for latching an input signal during the normal mode and for being non-functional in response to entering the power down mode, wherein the master latch means comprises a first plurality of transistors having first current leakage; and slave latch means having an input/output terminal coupled to the master latch means, wherein the slave latch means is for latching the signal present in the master latch means during the normal mode and for maintaining the signal that was latched during the normal mode in a latched condition during the power down mode, wherein the slave latch means comprises a second plurality of transistors having a second current leakage that is less than the first current leakage.

9. The flip-flop circuit of claim 8, further comprising a coupling switch for coupling the master latch to the slave latch.

10. The flip-flop of claim 8, wherein the slave latch means comprises:

a first switch having a first signal terminal as the input/output terminal, a second signal terminal, and a control input that receives a power down signal;

a first inverting circuit having an input coupled to the second signal terminal of the first switch and an output;

a second inverting circuit having an input coupled to the output of the first inverting circuit and an output;

a second switch having a first signal terminal coupled to the input of the first inverting circuit, a second signal terminal coupled to the output of the second inverting circuit, and a control input for receiving the clock signal; and a third switch having a first signal terminal coupled to the input of the first inverting circuit, a second signal terminal coupled to the output of the second inverting circuit, and a control input for receiving the power down signal.

11. The flip-flop circuit of claim 10, wherein the slave latch means further comprises a first transistor having a first current electrode coupled to the first signal terminal of the first switch, a second current electrode coupled to a reference terminal, and a control gate for receiving the power down signal.

12. The flip-flop circuit of claim 10, wherein a power supply voltage is applied to the slave latch means at a reduced lower level during the power down mode than during the normal mode.

13. The flip-flop circuit of claim 8, wherein at least one transistor of the first plurality of transistors is characterized as having a first gate dielectric thickness and each of the second plurality of transistors is characterized as having a second gate dielectric thickness, wherein the second gate dielectric thickness is greater than the first gate dielectric thickness.

14. The flip-flop circuit of claim 8, wherein the slave latch means comprises:

a first inverting circuit having an input and an output;

a second inverting circuit having an input coupled to the output of the first inverting circuit and an output;

first coupling means for coupling the input of the first inverting circuit and the output of the second inverting circuit during the power down mode; and second coupling means for coupling the input of the first inverting circuit to the input/output terminal and to the output of the second inverting circuit during the normal mode and for decoupling the input of the first inverting circuit and the output of the second inverting circuit from the input/output terminal during the power down mode.

15. The flip-flop circuit of 14, wherein the second coupling means comprises:

a first switch having a first signal terminal coupled to the input/output terminal, a second signal terminal coupled to the input of the first inverting circuit, and a control input for receiving a power down signal;

a second switch having a first signal terminal coupled to the input/output terminal, a second signal terminal, and a control input for receiving a clock signal; and a third switch having a first signal terminal coupled to the second signal terminal of the second switch, a second signal terminal coupled to the output of the second inverting circuit, and a control input for receiving the power down signal.

16. The flip-flop circuit of claim 14, wherein the second coupling means comprises:

a first switch having a first signal terminal coupled to the input/output terminal, a second signal terminal coupled to the input of the first inverting circuit, and a control input for receiving a power down signal; and a second switch having a first signal terminal coupled to second signal terminal of the first switch, a second signal terminal coupled to the output of the second inverting circuit, and a control input for receiving a clock signal.

17. The flip-flop circuit of claim 8, wherein the slave latch means comprises a first inverting circuit having an input coupled to the input/output terminal and an output;

a second inverting circuit having an input coupled to the output of the first inverting circuit and an output; and a first switch having a first signal terminal coupled to the input/output terminal, a second signal terminal coupled to the output of the second inverting circuit, and a control input for receiving a logical combination of a clock signal and a power down signal.

18. The flip-flop of claim 17, further comprising a second switch having a first signal terminal coupled to the master latch means, a second signal terminal coupled to the input/output terminal, and a control input for receiving the logical combination of the clock signal and the power down signal.

19. The flip-flop circuit of claim 17, further comprising a clocked inverter having an input coupled to the input/output terminal and an output for providing an output of the flip-flop circuit, wherein the clocked inverter is clocked to a disabled state by the power down signal.

20. A flip-flop comprising a master latch having an output coupled to a slave latch, wherein power is removed from the master latch during a power down mode, wherein the master latch comprises a first plurality of transistors, at least one transistor of the first plurality of transistors having a first gate dielectric thickness, the slave latch comprising:

an input/output terminal;

coupling means comprising a second plurality of transistors, at least one transistor of the second plurality of transistors having a second gate dielectric thickness that is greater than the first gate dielectric thickness; and a pair of inverters selectively coupled together by the coupling means to latch a signal received from the master latch through the input/output terminal during a portion of a normal mode of operation and all of the power down mode of operation, wherein the pair of inverting circuits comprises a third plurality of transistors having the second gate dielectric thickness; and an output circuit, coupled to the input/output terminal, comprising a plurality of transistors having the first gate dielectric thickness.

* * * * *